(12) United States Patent
Slippey et al.

(10) Patent No.: US 9,578,781 B2
(45) Date of Patent: Feb. 21, 2017

(54) HEAT MANAGEMENT FOR ELECTRONIC ENCLOSURES

(71) Applicant: ADVANCED COOLING TECHNOLOGIES, INC., Lancaster, PA (US)

(72) Inventors: Andrew J. Slippey, Lancaster, PA (US); Michael C. Ellis, Marietta, PA (US)

(73) Assignee: Advanced Cooling Technologies, Inc., Lancaster, PA (US)

( * ) Notice: Subject to any disclaimer, the term of this patent is extended or adjusted under 35 U.S.C. 154(b) by 157 days.

(21) Appl. No.: 14/274,075

(22) Filed: May 9, 2014

(65) Prior Publication Data

US 2015/0327402 A1 Nov. 12, 2015

(51) Int. Cl.
*H05K 7/20* (2006.01)

(52) U.S. Cl.
CPC ...... *H05K 7/20336* (2013.01); *H05K 7/20309* (2013.01); *H05K 7/20318* (2013.01); *H05K 7/20436* (2013.01)

(58) Field of Classification Search
CPC ................. H05K 7/20336; H05K 7/20436
See application file for complete search history.

(56) References Cited

U.S. PATENT DOCUMENTS

| | | | |
|---|---|---|---|
| 5,720,339 A | 2/1998 | Glass et al. | |
| 6,148,906 A | 11/2000 | Li et al. | |
| 6,169,247 B1 | 1/2001 | Craft, Jr. et al. | |
| 6,184,578 B1 | 2/2001 | Gardner et al. | |
| 6,388,882 B1 | 5/2002 | Hoover et al. | |
| 6,549,414 B1 * | 4/2003 | Tokuhara | G06F 1/20 165/104.33 |
| 6,795,310 B2 | 9/2004 | Ghosh | |
| 6,804,117 B2 * | 10/2004 | Phillips | F28D 15/0266 165/104.26 |
| 6,839,235 B2 | 1/2005 | St. Louis et al. | |
| 6,979,772 B2 | 12/2005 | Meng-Cheng et al. | |
| 7,130,193 B2 * | 10/2006 | Hirafuji | H05K 7/20445 165/104.33 |
| 7,277,286 B2 | 10/2007 | Lee | |
| 7,573,714 B2 | 8/2009 | Ali | |
| 8,305,754 B2 | 11/2012 | Wu et al. | |
| 8,451,600 B1 | 5/2013 | Ross | |
| 8,493,738 B2 | 7/2013 | Chainer et al. | |
| 2008/0112114 A1 | 5/2008 | Liao et al. | |
| 2009/0318071 A1 * | 12/2009 | Nemoz | H05K 7/20672 454/184 |

(Continued)

*Primary Examiner* — Tuan T Dinh
*Assistant Examiner* — Mukund G Patel
(74) *Attorney, Agent, or Firm* — McNees Wallace & Nurick LLC

(57) ABSTRACT

An enclosure and method for housing electrical components. The enclosure includes walls provided about the electrical components, the walls having poor thermal conductivity. At least one thermal transport device extends through at least one respective wall. The at least one thermal transport device has a first portion which is positioned within the enclosure, a second portion which is positioned outside of the enclosure and a transition portion which connects the first portion to the second portion. The at least one thermal transport device has a high effective thermal conductivity and provides a high thermal conductivity path for heat energy to pass from within the enclosure to outside the enclosure.

16 Claims, 4 Drawing Sheets

(56) References Cited

U.S. PATENT DOCUMENTS

| | | |
|---|---|---|
| 2010/0002395 A1 | 1/2010 | Bertrou et al. |
| 2010/0238628 A1 | 9/2010 | Hung et al. |
| 2011/0222237 A1* | 9/2011 | Fujiwara .................. G06F 1/20 361/679.48 |
| 2012/0180993 A1* | 7/2012 | Yoshikawa ........... H01L 23/427 165/104.21 |
| 2012/0250276 A1* | 10/2012 | Nakajima ............. G06F 1/1626 361/752 |

* cited by examiner

HEAT MANAGEMENT FOR ELECTRONIC ENCLOSURES

FIELD OF THE INVENTION

The present invention is directed to heat management systems and processes. More particularly, the present invention is directed to systems which utilize thermal transport devices to provide high conductive paths for heat energy through walls of an enclosure.

BACKGROUND OF THE INVENTION

In electronic as well as non-electronic devices, enclosures are commonly used to house device components. These enclosures perform several functions including providing structural support to the device components and vibration dampening. The enclosures are also referred to as housings. One example of an enclosure for an electronic device is a computer chassis. Typically, a computer includes a chassis that is generally a metallic frame. The chassis typically houses circuit boards, power supplies and wiring. The chassis typically includes four sidewalls and top and bottom elements. Generally, at least one of the chassis includes a removable cover such that the chassis components are easily accessible for replacement and repair purposes. The walls are typically thick and rugged such that they provide a robust structural support for the enclosed components.

The walls often enclose device components that can malfunction and cause device failure when they overheat. Some device components dissipate heat during their operation. They are referred to as heat sources. An example of the heat source includes the integrated chips that comprise the circuit boards installed in the computer chassis. The heat generated by the heat sources can damage not only the heat sources themselves but also the other components enclosed by the walls. To avoid device failure, therefore, the heat in the interior of the enclosure must be effectively managed. A common heat management technique includes designing a well-ventilated enclosure such that the heat can dissipate to the exterior of the enclosure. Another technique includes fabricating the enclosure from materials with high thermal conductivity. Still another technique includes installing a cooling fan inside the enclosure. Yet another effective heat management technique includes using a thermal transport device to absorb the heat from the interior of the enclosure and transfer it to a heat sink. The heat sink can include a cooler portion of the chassis away from the heat source. A well-known thermo-siphon device is the heat pipe, the configuration of which can be custom designed for the space and application.

While many of the structures and chassis provide proper structural support, there is a need to have lighter structures. Composite structures, such as electronics enclosures, have the potential to provide significant weight savings for a variety of systems. For vehicles, weight savings are directly tied to power consumption. Reducing vehicle power consumption provides advantages such as increasing range, improving fuel efficiency, and allowing for the use of more complex and power hungry systems. While composite structures can provide these savings, they exhibit poor thermal conductivity. This has limited their application to components with little to no heat flux or power.

Carbon fiber reinforced polymer (CFRP) composite material is a highly attractive structural material in applications where mass is critical. The carbon fiber matrix provides strength comparable to steel in a material with only about 25% of the density. In many instances, the carbon fiber reinforced polymer sheet can also be made thinner than a metal sheet would have to be made, further increasing the mass savings. Almost any portable equipment can benefit from less mass, which translates into less energy required to move the object. Thus, many automobiles and other transportation equipment employ carbon fiber reinforced polymer laminates for some components. In airplanes, weight becomes even more critical, since every ounce must be countered by lift forces in order to stay aloft, thus carbon composite materials are common on many state-of-the-art aircraft.

Thermal challenges have arisen with the increased use of composite structures in applications where excess heat is being generated within the structure. Where traditional metal structures can be designed to conduct and spread heat out over large external surfaces, composites have poor thermal conductivity and cannot be used in this manner. In effect, a composite enclosure acts to insulate the internal components. As a result, heat generated by components is trapped and the inside becomes hotter and hotter, which is detrimental to the performance and reliability of the electronics housed by the enclosure. For comparison, carbon fiber reinforced polymer materials typically have thermal conductivities on the order of 5 W/m-K, while carbon steel is near 50 W/m-K and aluminum is near 200 W/m-K. Therefore, the use of carbon fiber reinforced polymer composites for electronic enclosures is currently limited to applications where the heat dissipation requirement is low.

It would, therefore, be beneficial to provide a light weight structure which provides an alternate thermal path through the material to reduce the thermal penalty associated with the use of these materials without negating the benefits provided by their low mass. It would also be beneficial to provide an effective closure design which properly dissipates heat without the need to customize the structure and the heat paths for each application.

SUMMARY OF THE INVENTION

The assembly and method of the present invention utilize thermal transport devices, such as, but not limited to, constant conductance heat pipes, which transport significant heat energy through a limited cross-section of an enclosure with a minimal temperature penalty.

The assembly and method of the present invention utilize thermal transport devices that penetrate through the walls of an enclosure, such as, but not limited to, an enclosure made from carbon fiber reinforced polymer, the thermal transport devices providing a high conductivity path for heat energy to pass from within the enclosure to outside the enclosure.

The assembly and method of the present invention utilize thermal transport devices such that the thermal transport devices interrupt only a small area of a wall of the enclosure, thereby having minimal impact on the structural integrity of the wall.

The assembly and method of the present invention in which the thermal transport devices are embedded through walls of the enclosure in a post-formation operation and secured with epoxy.

The assembly and method of the present invention in which the thermal transport devices are inserted into molds prior to injection of the composite material for the walls, and the composite walls are formed directly around the thermal transport devices.

An embodiment is directed to an enclosure for housing electrical components. The enclosure includes walls provided about the electrical components, the walls having poor thermal conductivity. At least one thermal transport device extends through at least one respective wall. The at least one thermal transport device has a first portion which is positioned within the enclosure, a second portion which is positioned outside of the enclosure and a transition portion which connects the first portion to the second portion. The at least one thermal transport device has a high effective thermal conductivity and provides a high thermal conductivity path for heat energy to pass from within the enclosure to outside the enclosure.

An embodiment is directed to an enclosure for housing electrical components. The enclosure includes walls provided about the electrical components, the walls having poor thermal conductivity. At least one device that transports thermal energy using latent heat extends through at least one respective wall. The at least one device has an evaporator portion which is positioned within the enclosure and a condenser portion which is positioned outside of the enclosure. The at least one device has a high effective thermal conductivity and provides a high thermal conductivity path for heat energy to pass from the evaporator within the enclosure to the condenser outside the enclosure.

An embodiment is directed to a method of thermally conducting heat from inside an enclosure formed of composite material. The method includes: collecting heat from the inside of the enclosure at an evaporator of a device that transports thermal energy using latent heat; conducting the heat from the evaporator of the device through a wall of the enclosure to a condenser of the device; and dissipating the heat from the condenser outside of the enclosure. The device has a high effective thermal conductivity and provides a high thermal conductivity path for heat energy to pass from the evaporator to the condenser.

Other features and advantages of the present invention will be apparent from the following more detailed description of the preferred embodiment, taken in conjunction with the accompanying drawings which illustrate, by way of example, the principles of the invention.

BRIEF DESCRIPTION OF THE DRAWINGS

Wherever possible, the same reference numbers will be used throughout the drawings to represent the same parts.

DETAILED DESCRIPTION OF THE INVENTION

Figure 1:
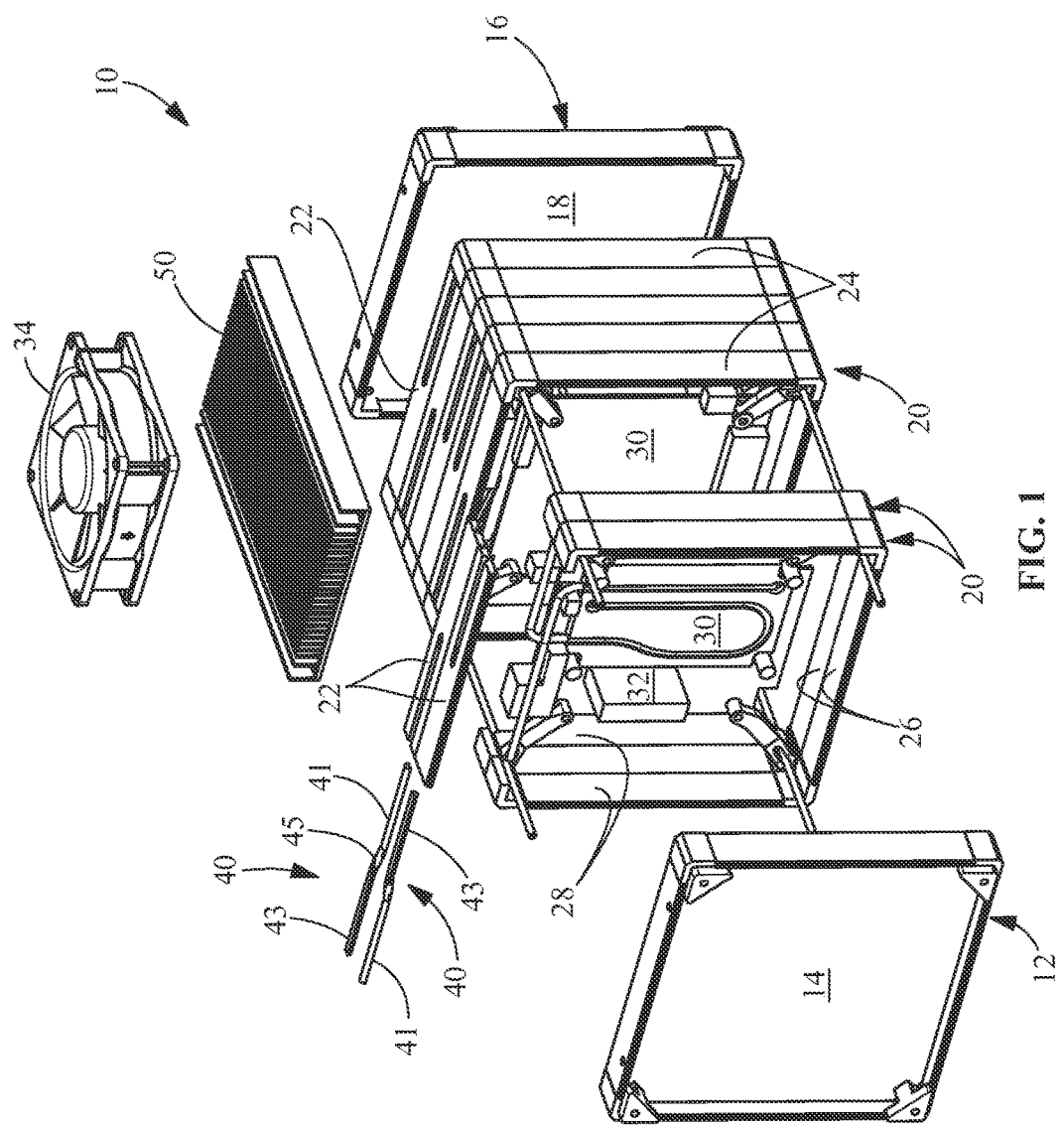
FIG. 1 is an exploded perspective view of an illustrative enclosure with modular components, the modular components having thermal transport devices to remove heat from the interior of the modular components to the outside of the modular components.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features; the scope of the invention being defined by the claims appended hereto.

Provided is a heat management/transfer assembly, a heat transfer process, and a process of assembling a heat transfer assembly which can be used for any enclosure, including, but not limited to, an enclosure made from composite material. Embodiments of the present disclosure, in comparison to similar concepts that do not include one or more of the features disclosed herein, increase heat transfer through surfaces, increase heat transfer from composite structures, increase heat transfer through composite surfaces, overcome mechanical limitations, decrease weight, increase heat transfer efficiency, other improvements and advantages, and combinations thereof.

As shown in the illustrative embodiment of FIG. 1, the heat management/transfer assembly and the heat transfer process is used to facilitate the heat transfer from inside an enclosure 10 to the outside of the enclosure. In the particular illustrative embodiment shown, the enclosure 10 is a circuit card stack which has modular components or slices which include: a first end module 12 having a first end wall 14; a second end module 16 having a second end wall 18; and at least one interior enclosure or module 20 having side walls 22, 24, 26, 28 which surround respective electrical components 30, such as, but not limited to, a circuit card. Each circuit card 30 includes one or more heat sources 32, such as, but not limited to integrated circuit chips or other heat generating component. In the embodiment shown, a fan 34 is provided to facilitate the heat transfer. The enclosure 10 and components 30 are merely illustrative, as other embodiments of the enclosure and the components can be used without departing from the scope of the invention.

In the illustrative embodiments shown, one or more walls are made from a material having the weight and structural characteristics required, allowing the enclosures to be made from composite materials which has a highly attractive structural material in applications where mass is critical. Such illustrative materials include, but are not limited to, a carbon and polymer composite material or a glass and polymer composite material. The carbon and polymer material may be, but is not limited to, a Carbon Fiber Reinforced Polymer (CFRP) composite material. The carbon fiber matrix provides strength comparable to steel in a material with only about 25% of the density. In many instances, the CFRP sheet can also be made thinner than a metal sheet would have to be made, further increasing the mass savings. Almost any portable equipment can benefit from less mass, which translates into less energy required to move the object.

As previously stated, thermal challenges have arisen with the increased use of composites in applications where excess heat is being generated internally. Where known metal structures can be designed to conduct and spread heat out over large external surfaces, known composite structures have poor thermal conductivity and cannot be used in this manner. In effect, the known composite enclosure acts to insulate the internal components. As a result, heat generated by components is trapped and the inside becomes hotter and hotter, which is detrimental to the performance and reliability of the electronics housed by the enclosure.

Thermal transport devices 40, such as, but not limited to, devices that transports thermal energy using latent heat, constant conductance heat pipes (CCHPs), thermosyphons, loop heat pipes, or any passive, two-phase device, are embedded in, in thermal communication with, extend through, or penetrate through one or more respective walls 22, 24, 26, 28 of a respective module 20 and are capable of transporting significant heat energy from the inside of the enclosure 10 to the outside of the enclosure through a limited cross-section with a minimal temperature penalty. In the illustrative embodiment shown, the constant conductance heat pipes are passive, two-phase, thermal transport devices which have extremely high effective thermal conductivities on the order of thousands of W/m-K. In illustrative embodiments, the thermal conductivity of the thermal transport devices 40 is greater than 1 kW/m-K, greater than 10 kW/m-K, greater than 100 kW/m-K, between 1 kW/m-K and 100 kW/m-K, or any combination or sub-combination thereof. The heat pipes serve as thermal vias which provide a high thermal conductivity path for heat energy to pass from within the enclosure 10 to outside the enclosure 10. The constant conductance heat pipes 40 extend through only a small area of a respective wall 22, 24, 26, 28, thereby causing minimal impact on the structural integrity of the wall 22, 24, 26, 28 and the enclosure 10.

The thermal transport devices or heat pipes 40 may be inserted or embedded through a respective wall 22, 24, 26, 28 of the module 20 using different methods or processes. In one illustrative embodiment, the heat pipes 40 are inserted through a respective wall 22, 24, 26, 28 of the module 20 in a post-formation operation and secured with epoxy, thereby allowing the carbon fiber reinforced polymer walls 22, 24, 26, 28 to be fabricated without any change to the standard process or tooling for fabricating the walls. In an alternative embodiment, the heat pipes 40 can be inserted into molds prior to injection of the carbon fiber reinforced polymer. The carbon fiber reinforced polymer is then introduced into the mold, allowing the polymer to flow about the heat pipes 40, such that the composite walls 22, 24, 26, 28 are formed directly around the heat pipes 40, embedding the heat pipes 40 in respective walls 22, 24, 26, 28 of the module 20. First portions 41 of the heat pipes 40 are positioned in the enclosure or module 20 and second portions 43 are positioned outside of the enclosure or module 20. Transition portions 45 extend through the respective walls and connect the first portions 41 to the second portions 43. In this process, the heat pipes must be manufactured from materials which are able to withstand the heat and other manufacturing parameters of the injection molding process. In addition, the molds must be configured to secure the heat pipe 40 in position during the molding process.

In the embodiments shown, the constant conductance heat pipes 40 may be positioned proximate circuit cards 30 or other components which dissipate significant power, and may be employed on one, or more than one wall, depending on how much power is dissipated by the particular card or component. In specific applications heat pipes 40 may be used to cool a particularly hot component or chip by providing a direct heat path through the wall of the enclosure 10. Alternatively, the heat pipes 40 may be positioned without regard to a particular component or card, thereby allowing heat to be dissipated from the inside of the enclosure 10 without regard to the particular configuration of the components or cards. In addition, and as will be more fully describe below, fins 50 may be placed on the heat pipe 40 inside the enclosure 10 to facilitate in collecting the heat from the air within the enclosure 10. The fins 50 may also be placed on the heat pipe 40 outside the enclosure 10 to aid in heat dissipation or rejection to the surrounding air.

While many various combinations and permutations of external and internal components of the enclosure 10, including, but not limited to the circuit boards 30, walls 22, 24, 26, 28, heat pipes 40 and fins 50, can comprise the thermal management system, FIGS. 2 through 7 show illustrative embodiments which illustrate six representative permutations. All the thermal management system illustrated focus on removing heat from a module 20 of the stack or enclosure 10.

Figure 2:
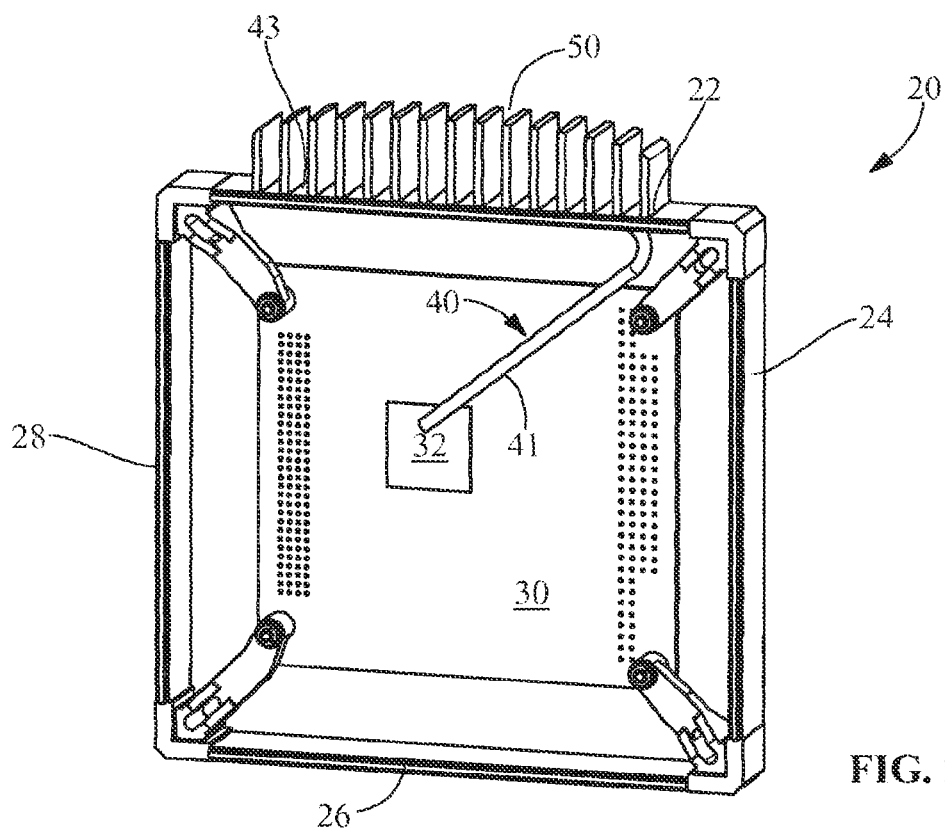
FIG. 2 is a perspective view of a modular component with an illustrative first thermal transport device.

Referring to FIG. 2, a first illustrative embodiment is shown. In this embodiment, a respective side wall 22 of module 20 is made of a conductive material, such as, but not limited to aluminum. The side wall of conductive material may be included in the module 20 using different methods or processes. In one illustrative embodiment, the conductive material is inserted in a post-formation operation and secured with epoxy, thereby allowing the other carbon fiber reinforced polymer walls 24, 26, 28 to be fabricated without any change to the standard process or tooling for fabricating the module 20. In an alternative embodiment, the conductive material can be inserted into molds prior to injection of the carbon fiber reinforced polymer. The carbon fiber reinforced polymer is then introduced into the mold, allowing the polymer to flow about the conductive material, such that the composite walls 24, 26, 28 are formed directly around the wall 22, embedding the conductive material wall 22 in the module 20.

Because of the modular design of the enclosure 10, this substitution can be made with little difficulty, assuming any coefficient of thermal expansion mismatch can be accounted for. With such a conductive wall 22, external fins 50 can be an integral feature. The heat pipes 40 extend from a localized heat source on the circuit board 30 and extend to the conductive wall 22. Alternatively, the heat pipes may be positioned without regard to a particular heat source. The heat pipes 40 are in thermal contact with the conductive wall 22, thereby allowing the heat pipes 40 to transport heat from a localized source to the wall 22. In one embodiment, the heat pipes 40 are configured and implemented after the wall portions 22, 24, 26, 28 of the module 20 have been fabricated.

Figure 3:
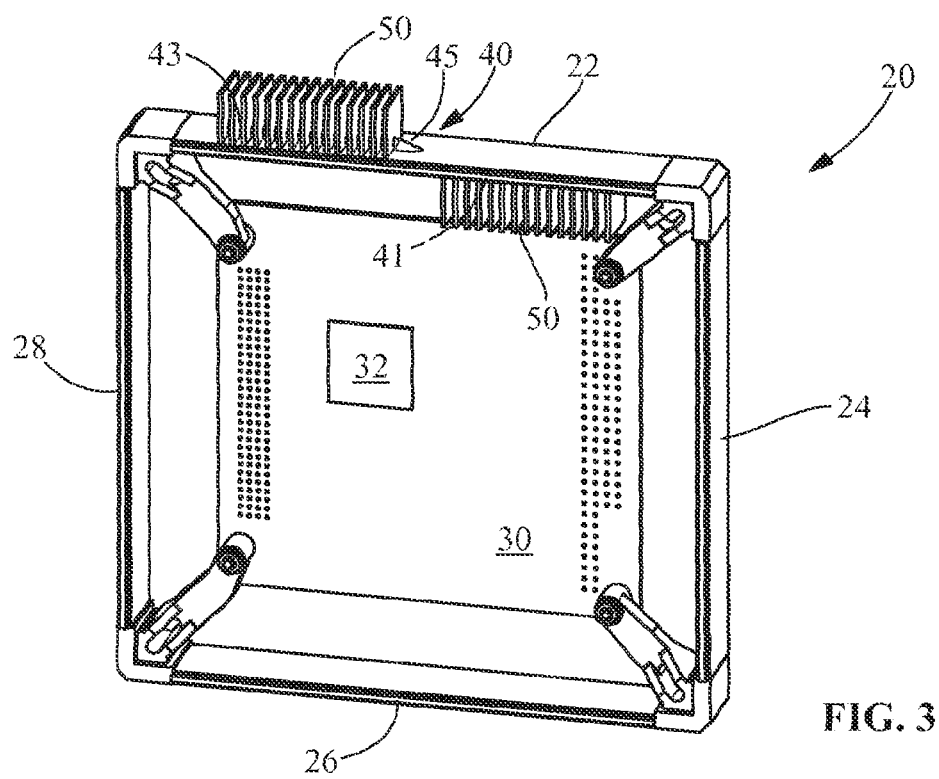
FIG. 3 is a perspective view of a modular component with an illustrative second thermal transport device.

Referring to FIG. 3, a second illustrative embodiment is shown. The heat pipe 40 is used to conduct heat through the wall 22. The first portion 41, which is approximately half of the heat pipe 40, is exposed on the inside of the enclosure 10 and serves as an evaporator. The second portion 43, which is approximately the other half of the heat pipe 40, is exposed on the outside of the enclosure 10 and serves as a condenser of the heat pipe 40. The heat pipe 40 is jogged or bent to form the transition portion 45, allowing the heat pipe 40 to be embedded flush with the surface of wall 22, thereby allowing the heat pipe 40 to be compatible with a variety of other internal and external configurations. As shown in the illustrative embodiment, the heat pipe 40 may have fins 50 which extend from the portion which is outside the enclosure 10, the portion which is inside the enclosure 10 or from the portions which extend both inside and outside of the enclosure 10. Alternatively, the heat pipe 40 may have not fins.

The embodiment shown in FIG. 3 does not require a heat pipe which extends internally to interface with a localized heat source. Instead, this embodiment relies on internal free convection within the enclosure 10 to transport the waste heat to the fins 50 attached to the heat pipe 40 which are located within the module 20 or enclosure 10. The heat energy then passes via the heat pipe 40 through the wall 22 to another set of fins 50 located outside of the module 20 or enclosure 10 to dissipate the heat external of the module 20 or enclosure 10. This embodiment is suitable for circuit boards 30 or slices with lower heat generation or lower distributed heat loads. This configuration isolates any board specific design aspect from the wall and heat dissipation solution.

Figure 4:
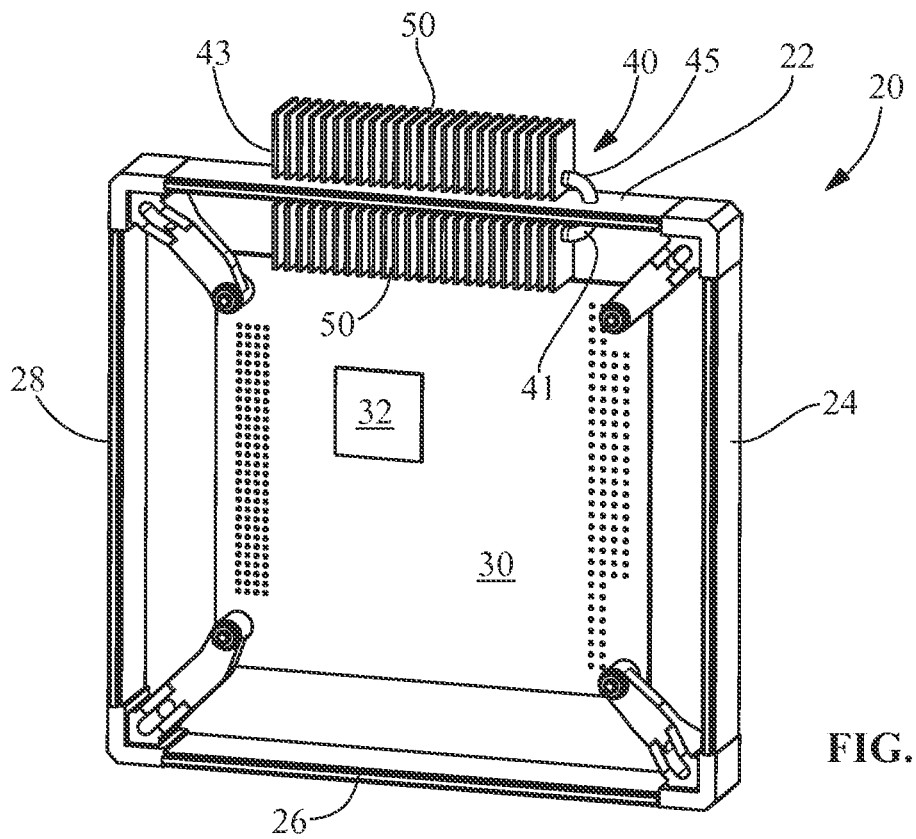
FIG. 4 is a perspective view of a modular component with an illustrative third thermal transport device.

Referring to FIG. 4, a third illustrative embodiment is shown. The heat pipe 40 is used to conduct heat through the wall 22. The first portion 41, which is approximately half of the heat pipe 40, is exposed on the inside of the enclosure 10 and serves as the evaporator. The second portion 43, which is essentially the other half of the heat pipe 40, is exposed on the outside of the enclosure 10 and serves as the condenser of the heat pipe 40. The heat pipe 40 is bent to form the transition portion 45, allowing the heat pipe 40 to be extended through the surface of wall 22, thereby allowing the heat pipe 40 to be compatible with a variety of other internal and external configurations. In the embodiment shown, the heat pipe 40 is perpendicular or essentially perpendicular to the wall 22 in the area were the heat pipe 40 passes through the wall 22. As shown in the illustrative embodiment, the heat pipe 40 may have fins 50 which extend from the portion which is outside the enclosure 10, the portion which is inside the enclosure 10 or from the portions which extend both inside and outside of the enclosure 10. Alternatively, the heat pipe 40 may have not fins.

Similar to the embodiment shown in FIG. 3, the embodiment shown in FIG. 4 does not require a heat pipe which extends internally to interface with a localized heat source. Instead, this embodiment relies on internal free convection within the enclosure 10 to transport the waste heat to the fins 50 attached to the heat pipe 40 which are located within the module 20 or enclosure 10. The heat energy then passes via the heat pipe 40 through the wall 22 to another set of fins 50 located outside of the module 20 or enclosure 10 to dissipate the heat external of the module 20 or enclosure 10. This embodiment is suitable for circuit boards 30 or slices with lower heat generation or lower distributed heat loads.

Figure 5:
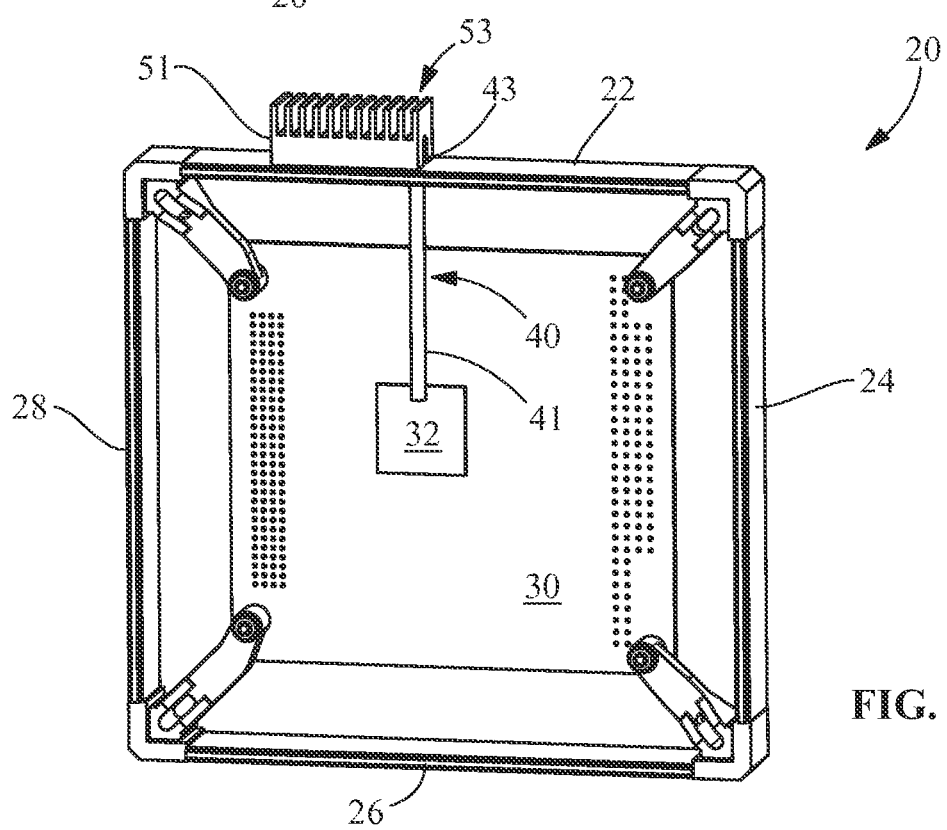
FIG. 5 is a perspective view of a modular component with an illustrative fourth thermal transport device.

Referring to FIG. 5, a fourth illustrative embodiment is shown. The heat pipe 40 is used to conduct heat through the wall 22. The first portion 41, which is approximately half of the heat pipe 40, is exposed on the inside of the enclosure 10 and serves as the evaporator. The second portion 43, which is approximately the other half of the heat pipe 40, is exposed on the outside of the enclosure 10 and serves as the condenser of the heat pipe 40. The heat pipe 40 is bent to form the transition portion (not shown), allowing the heat pipe 40 to extend through the surface of wall 22. In the embodiment shown, the heat pipe 40 is perpendicular or essentially perpendicular to the wall 22 in the area were the heat pipe 40 passes through the wall 22. The heat pipe 40 exits the wall 22 and then bends 90° to run through a base 51 of an aluminum fin stack 53. In this embodiment, the heat pipe 40 goes into the base 51 of a fin stack 53 rather than having fins attached directly to the heat pipe 40. Regardless of the particular embodiment described, the geometry of the fins 50 or fin stack 53 shown are merely illustrative and not optimized for any particular heat load.

In this illustrative embodiment, the heat pipes 40 extend from a localized heat source on the circuit board 30 and extend through the wall 22. The heat pipes 40 transport heat from a localized source through the wall 22.

Figure 6:
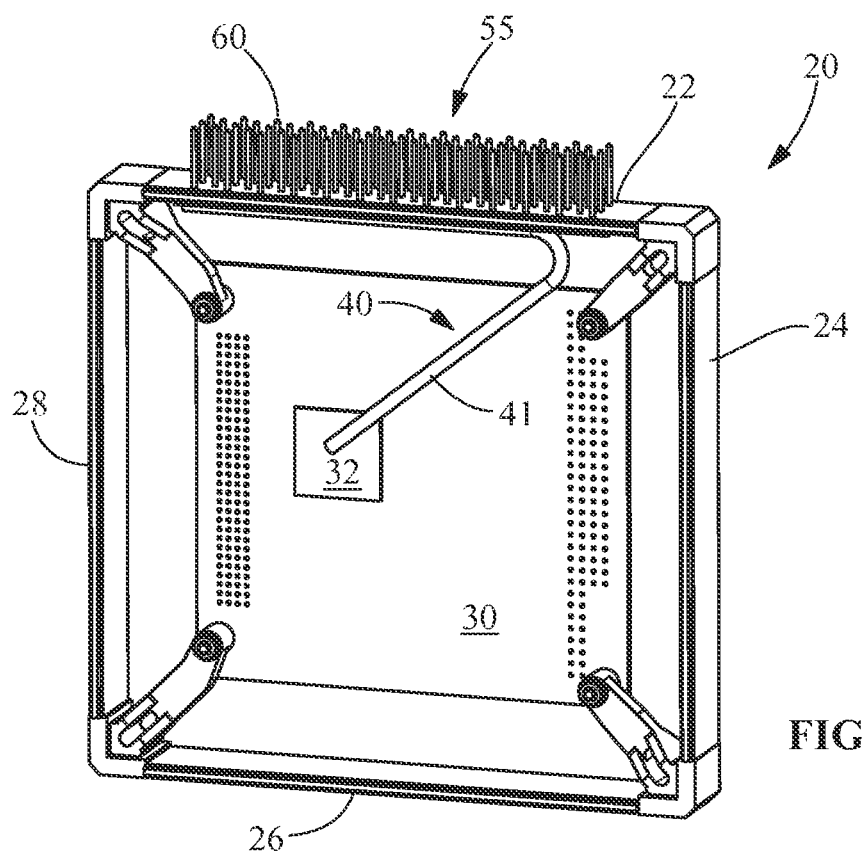
FIG. 6 is a perspective view of a modular component with an illustrative fifth thermal transport device.

Referring to FIG. 6, a fifth illustrative embodiment is shown. This embodiment uses a different type of fin stack 55, such as, but not limited to, pin fins. Such fin stacks 55 provide excellent performance in natural convection situations. In this embodiment, the base (not shown) of the pin fin array or fin stack 55 is positioned on the inside of the wall 22 proximate the heat pipe 40. The individual pins 60 pass perpendicularly or essentially perpendicularly through the wall 22. In this embodiment, the heat pipe 40 does not pass through the wall 22. Heat is delivered to the base of the fin stack 55 via the heat pipe 40. The heat is then conducted through the pins 60 to be dissipated outside of the enclosure 10. By placing the base of the pin fins 55 on the inside of the wall 22, the small holes which are formed to accommodate the pins 60 extend through the enclosure wall 22 are sealed with carbon fiber reinforced polymer material, epoxy or other material having the sealing characteristics required.

Figure 7:
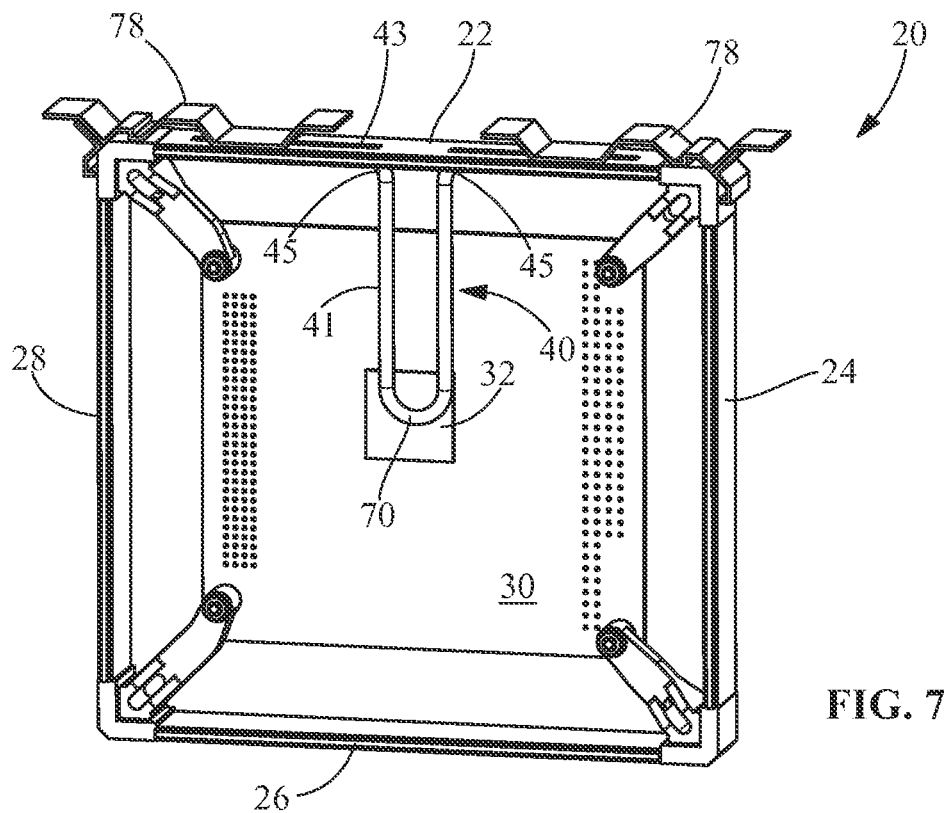
FIG. 7 is a perspective view of a modular component with an illustrative sixth thermal transport device.

Referring to FIG. 7, a sixth embodiment is shown. As previously described, the heat pipe 40 is used to conduct heat through the wall 22. A first portion 41 of the heat pipe 40 is exposed on the inside of the enclosure 10 and serves as the evaporator. The second portion 43 of the heat pipe 40 is exposed on the outside of the enclosure 10 and serves as the condenser of the heat pipe 40. The heat pipe 40 is bent to form transition portions 45, allowing the heat pipe 40 to be embedded flush with the surface of the wall 22, thereby allowing the heat pipe 40 to be compatible with a variety of other internal and external configurations. As best shown in FIG. 7, the heat pipe 40 has a generally "UT" shaped configuration, allowing the heat pipe 40 to pass through and be embedded in the wall 22 to be flush with the outer surface of the wall 22. The U-shaped portion or center portion 70 of the pipe loops down to a localized heat source or hot spot on the circuit board 30. While a generally "UT" shape is shown, other shapes, including, but not limited to, two "L" shaped heat pipes could be used without departing from the scope of the invention and to produce a similar result.

In this embodiment, metal corner foot rails 78 are used to facilitate the dissipation of heat from the enclosure 10. The rails 78 extended to make contact with the wall 22 and the portions 43 of the heat pipes 40 where the heat pipes 40 are exposed. These rails 78 act as fins or a conduction path to draw heat from the portions 43 of the heat pipe 40 to provide heat dissipation and cool the components in the enclosure 10. To maintain the ability to disassemble and replace modules 20 in the field, the rails 78 are not permanently affixed to the walls 22 and must rely on the spring forces of the rails 78 and the portions 43 of the heat pipes 40 to provide sufficient contact and to maintain the thermal contact over time and over various temperature ranges. The base upon which the enclosure 10 is mounted will also provide additional pressure on the rails 78. In other illustrative embodiments, a thermal gap pad (not shown) may be provided to further ensure good thermal contact. One advantage of this embodiment is that the external solution spans all the modules 20 and thus can spread heat across all the sections of the enclosure 10. Additional heat pipes may be added to increase the heat spreading as well.

As previously described, various embodiments, such as the illustrative embodiment shown and described with respect to FIG. 3, require the heat pipe 40 to be not only embedded in the wall 22, but actually jogged through the wall 22. In order to provide a proper temperature difference between the heated end (evaporator) and the exposed end (condenser) the bending and formation of the heat pipe 40 must be controlled. The optimum temperature difference between the heated end (evaporator) and the exposed end (condenser) at a given power level is less than 20 degrees Celsius, less than 10 degrees Celsius, less than 5 degrees Celsius, less than 4 degrees Celsius, less than 3 degrees Celsius, less than 2 degrees Celsius, less than 1 degree Celsius. The temperature difference is affected by various factors, including, but not limited to, amount of insulation around the heat pipes, the geometry of the heat pipes, and the geometry of the jog of the heat pipes.

In various illustrative embodiments, the use of a single wrap of screen wick helped prevent pinching off the vapor space at the bend of the heat pipe 40. In illustrative embodiments, such as FIGS. 1 and 3, the angle of the jog for the transition portions 45 of the heat pipe 40 is less than 20 degrees, less than 15 degrees, less than 10 degrees, between about 1 degree and about 20 degrees, between about 5 degrees and about 15 degrees, about 20 degrees, about 10 degrees, or any combination or sub-combination thereof. In illustrative embodiments, the corners of the heat pipe 40 formed when the heat pipe is bent are filed down to provide a bend radius rather than a sharp point.

When a heat pipe 40 is embedded in a wall, three sides of the heat pipe are captured in the material and are not exposed. This reduction in the exposed surface area of the heat pipe 40 means less heat can be rejected via natural convection. Consequently, as a result of three sides of the condenser side of the heat pipe 40 being encapsulated in the composite material, a larger temperature drop is experienced across the heat pipe 40. In order to decrease the temperature drop, the heat pipe 40 may be flattened and maintained in the wall with an epoxy. In so doing, more surface area of the heat pipe 40 is exposed so that more heat can be rejected via natural convection.

Currently the use of CFRP composites for electronic enclosures is limited to applications where the heat dissipation requirement is low. For higher heat loads, aluminum enclosures must be used. Some work is being done at the materials level to find ways to increase the thermal conductivity of CFRP composites, however these solutions typically require adding significant complexity to the fabrication process. These approaches involve alignment of the carbon fibers or replacement of some fibers with other materials. Particularly in the cases where the composite material is mixed up and then formed to its final shape by injection molding processes, this type of careful fiber alignment is not possible. Additionally, most of the work at the material level is only capable of increasing the in-plane thermal conductivity, while the thru-plane conductivity remains poor.

In summary, composite structures, such as electronics enclosures, have the potential to provide significant weight savings for a variety of systems. For vehicles, weight savings are directly tied to power consumption. Reducing vehicle power consumption provides advantages such as increasing range, improving fuel efficiency, and allowing for the use of more complex and power hungry systems. While composite structures can provide these savings, they exhibit poor thermal conductivity. This has limited their application to components with little to no heat flux or power. The use of the heat pipes as described herein provides an alternate thermal path through the composite material, which reduces the thermal penalty associated with the use of these materials without negating the benefits provided by their low mass. Circumventing the thermal limitation of composite materials facilitates increased adoption of these strong, lightweight materials. This expands the potential applications of composite materials, which has the potential to affect multiple markets, such as, but not limited to, spacecraft, unmanned vehicles, avionics, and other military and commercial applications. The present invention also requires less mass and weight than if solid copper or aluminum was used as a thermal via.

While the invention has been described with reference to a preferred embodiment, it will be understood by those skilled in the art that various changes may be made and equivalents may be substituted for elements thereof without departing from the spirit and scope of the invention as defined in the accompanying claims. In particular, it will be clear to those skilled in the art that the present invention may be embodied in other specific forms, structures, arrangements, proportions, sizes, and with other elements, materials, and components, without departing from the spirit or essential characteristics thereof. One skilled in the art will appreciate that the invention may be used with many modifications of structure, arrangement, proportions, sizes, materials, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims, and not limited to the foregoing description or embodiments.

The invention claimed is:

1. An enclosure for housing electrical components, the enclosure comprising:
   walls provided about the electrical components, the walls having poor thermal conductivity;
   at least one heat pipe extending through at least one respective wall, the at least one heat pipe having a first portion, a second portion and a transition portion, the first portion serves as an evaporator and is positioned within the enclosure, the second portion serves as a condenser and is positioned outside of the enclosure, at least one of the first portion or the second portion is embedded in the at least one respective wall and extends parallel to the at least one respective wall, the at least one of the first portion or the second portion having three sides that are captured in the at least one respective wall, the at least one of the first portion or the second portion is flush with a surface of the at least one respective wall, the at least one of the first portion or the second portion is flattened to expose more surface area of the at least one of the first portion or the second portion to allow more heat to be rejected via natural convection, the transition portion connects the first portion to the second portion and is jogged or bent relative to the first portion and the second portion, the transition portion is embedded in and extends through the at least one respective wall;

the at least one heat pipe has a high effective thermal conductivity and provides a high thermal conductivity path for heat energy to pass from within the enclosure to outside the enclosure.

2. The enclosure as recited in claim 1, wherein the walls are made from a carbon and polymer composite material.

3. The enclosure as recited in claim 1, wherein the walls are made from a glass and polymer composite material.

4. The enclosure as recited in claim 1, wherein the at least one heat pipe is a thermosyphon.

5. The enclosure as recited in claim 1, wherein the at least one heat pipe has fins provided on the first portion.

6. The enclosure as recited in claim 1, wherein the at least one heat pipe has fins provided on the second portion.

7. The enclosure as recited in claim 1, wherein the transition portion of the at least one heat pipe is bent at an angle of between about 1 degree and about 20 degrees.

8. The enclosure as recited in claim 1, wherein the second portion of the at least one heat pipe is flattened and maintained in the at least one respective wall, allowing more surface area of the at least one heat pipe to be exposed so that more heat can be rejected from the at least one heat pipe via natural convection.

9. An enclosure for housing electrical components, the enclosure comprising:
walls provided about the electrical components, the walls having poor thermal conductivity;
at least one device that transports thermal energy using latent heat extending through at least one respective wall, the at least one device having an evaporator portion which is positioned within the enclosure and a condenser portion which is positioned outside of the enclosure, at least one of the evaporator portion or the condenser portion embedded in the at least one respective wall, the at least one of the evaporator portion or the condenser portion extending parallel to the at least one respective wall, the at least one of the evaporator portion or the condenser portion having three sides that are captured in the at least one respective wall, the at least one of the evaporator portion or the condenser portion is flush with a surface of the at least one respective wall, a transition portion connects the evaporator portion to the condenser portion and is jogged or bent relative to the evaporator portion and the condenser portion, the transition portion is embedded in and extends through the at least one respective wall;
the at least one device has a high effective thermal conductivity and provides a high thermal conductivity path for heat energy to pass from the evaporator within the enclosure to the condenser outside the enclosure.

10. The enclosure as recited in claim 9, wherein the walls are made from a composite material.

11. The enclosure as recited in claim 10, wherein the walls are made from a carbon and polymer composite material.

12. The enclosure as recited in claim 9, wherein the at least one device is a passive, two-phase device.

13. The enclosure as recited in claim 12, wherein the at least one device is a heat pipe.

14. The enclosure as recited in claim 12, wherein the at least one device has fins provided on the evaporator portion.

15. The enclosure as recited in claim 12, wherein the at least one device has fins provided on the condenser portion.

16. A method of thermally conducting heat from inside an enclosure formed of composite material, the method comprising:
collecting heat from the inside of the enclosure at an evaporator of a heat pipe that transports thermal energy using latent heat;
conducting the heat from the evaporator of the heat pipe through a transition portion of the heat pipe which is embedded in a wall of the enclosure to a condenser of the heat pipe, the transition portion connects the evaporator portion to the condenser portion and is jogged or bent relative to the evaporator portion and the condenser portion, at least one of the evaporator or condenser is embedded in a wall of the enclosure and is flush with a surface of the wall, the at least one of the evaporator portion or the condenser portion having three sides that are captured in the wall;
dissipating the heat from the condenser outside of the enclosure;
wherein the heat pipe has a high effective thermal conductivity and provides a high thermal conductivity path for heat energy to pass from the evaporator to the condenser, and the condenser is embedded to allow the heat pipe to be compatible with various external configurations.

* * * * *